(12) United States Patent
Devilliers et al.

(10) Patent No.: US 12,541,155 B2
(45) Date of Patent: *Feb. 3, 2026

(54) COAXIAL SEE-THROUGH INSPECTION SYSTEM

(71) Applicant: Tokyo Electron Limited, Tokyo (JP)

(72) Inventors: Anton J. Devilliers, Clifton Park, NY (US); Anthony R. Schepis, Averill Park, NY (US); David Conklin, Saratoga Springs, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/404,687

(22) Filed: Aug. 17, 2021

(65) Prior Publication Data

US 2022/0050386 A1    Feb. 17, 2022

Related U.S. Application Data

(60) Provisional application No. 63/066,779, filed on Aug. 17, 2020.

(51) Int. Cl.
*G03F 7/00*       (2006.01)
*G01N 21/956*     (2006.01)
(Continued)

(52) U.S. Cl.
CPC ...... *G03F 7/70633* (2013.01); *G03F 7/70466* (2013.01); *G03F 7/7065* (2013.01);
(Continued)

(58) Field of Classification Search
CPC ............. G03F 7/70633; G03F 7/70466; G03F 7/7065; G03F 7/70683; G03F 7/7085;
(Continued)

(56) References Cited

U.S. PATENT DOCUMENTS 5,783,342 A * 7/1998 Yamashita ................ G03F 7/38
                                                   430/311
6,582,376 B2   6/2003 Baghdassarian
(Continued)

FOREIGN PATENT DOCUMENTS

JP    S62-194638       8/1987
JP    2006-108582 A    4/2006
(Continued)

OTHER PUBLICATIONS

International Search Report and Written Opinion issued Dec. 7, 2021 in PCT/US2021/046362, 9 pages.
(Continued)

*Primary Examiner* — Richard A Hansell, Jr.
(74) *Attorney, Agent, or Firm* — Oblon, McClelland, Maier & Neustadt, L.L.P.

(57) ABSTRACT

Aspects of the present disclosure provide an inspection system, which can include an image module and processing circuitry. The imaging module can image a wafer with a first light beam and a second light beam. The first light beam can be coaxially aligned with the second light beam, and image a first pattern located on a front side of a wafer to form a first image. The second light beam can image a second pattern located below the first pattern to form a second image via quantum tunneling imaging or infrared transmission imaging. The second light beam can have power sufficient to pass through at least a portion of a thickness of the wafer and reach the second pattern. The processing circuitry can perform image analysis on the first image and the second image to calculate an overlay value of the first and second patterns and/or defects of the wafer.

14 Claims, 6 Drawing Sheets

(51) Int. Cl.
| | |
|---|---|
| *G03F 9/00* | (2006.01) |
| *G06T 7/00* | (2017.01) |
| *G06T 7/33* | (2017.01) |
| *G06T 7/73* | (2017.01) |
| *G06V 10/24* | (2022.01) |
| *H01L 21/66* | (2006.01) |
| *H01L 23/544* | (2006.01) |
| *H04N 23/56* | (2023.01) |

(52) U.S. Cl.
CPC ........ *G03F 7/70683* (2013.01); *G03F 7/7085* (2013.01); *G03F 9/7046* (2013.01); *G03F 9/7073* (2013.01); *G03F 9/7084* (2013.01); *G03F 9/7088* (2013.01); *G06T 7/001* (2013.01); *G06T 7/337* (2017.01); *G06T 7/74* (2017.01); *G06V 10/245* (2022.01); *H01L 22/20* (2013.01); *H01L 23/544* (2013.01); *G01N 21/95607* (2013.01); *G06T 2207/10048* (2013.01); *G06T 2207/10152* (2013.01); *G06T 2207/30148* (2013.01); *G06V 2201/06* (2022.01); *H01L 2223/54426* (2013.01); *H04N 23/56* (2023.01)

(58) Field of Classification Search
CPC .... G03F 9/7046; G03F 9/7073; G03F 9/7084; G03F 9/7088; G06T 7/001; G06T 7/337; G06T 7/74; G06T 2207/10048; G06T 2207/10152; G06T 2207/30148; G06T 2207/10061; G06V 10/245; G06V 2201/06; H01L 22/20; H01L 23/544; H01L 2223/54426; H04N 5/2256; G01N 21/95607
See application file for complete search history.

(56) References Cited

U.S. PATENT DOCUMENTS

| | | | |
|---|---|---|---|
| 6,658,032 B2 | 12/2003 | Wiemeyer | |
| 7,004,909 B1 | 2/2006 | Patel et al. | |
| 7,064,329 B2 | 6/2006 | Webber | |
| 7,084,955 B2 | 8/2006 | Gui et al. | |
| 7,420,676 B2 * | 9/2008 | Lof | G03F 9/7003 |
| | | | 430/30 |
| 7,473,229 B2 | 1/2009 | Webber | |
| 7,502,115 B2 | 3/2009 | Patel et al. | |
| 7,684,039 B2 | 3/2010 | Adel et al. | |
| 7,903,704 B2 | 3/2011 | Patel et al. | |
| 8,014,430 B2 | 9/2011 | Patel et al. | |
| 8,068,524 B1 | 11/2011 | Patel et al. | |
| 8,121,164 B1 | 2/2012 | Lyakh et al. | |
| 8,247,775 B2 | 8/2012 | Patel et al. | |
| 8,360,974 B2 | 1/2013 | Patel et al. | |
| 8,659,743 B2 * | 2/2014 | Mishima | G03F 7/70633 |
| | | | 355/72 |
| 8,994,947 B2 | 3/2015 | Patel et al. | |
| 9,077,153 B2 | 7/2015 | Maulini et al. | |
| 9,285,310 B2 | 3/2016 | Patel et al. | |
| 9,608,408 B2 | 3/2017 | Lyakh et al. | |
| 9,903,823 B2 | 2/2018 | Lu et al. | |
| 10,025,199 B2 | 7/2018 | Den Boef et al. | |
| 10,048,132 B2 | 8/2018 | Hill et al. | |
| 10,126,099 B1 * | 11/2018 | Hammond | F41G 3/165 |
| 10,230,210 B2 | 3/2019 | Patel et al. | |
| 10,401,228 B2 | 9/2019 | Hill et al. | |
| 10,495,982 B2 * | 12/2019 | Chang | H01J 37/3174 |
| 10,642,161 B1 | 5/2020 | Corliss et al. | |
| 10,658,210 B2 | 5/2020 | He et al. | |
| 10,809,628 B2 | 10/2020 | Den Boef et al. | |
| 10,998,690 B2 | 5/2021 | Patel et al. | |
| 11,050,220 B2 | 6/2021 | Barron-Jimenez et al. | |
| 2004/0125299 A1 * | 7/2004 | Nakamura | G02F 1/1339 |
| | | | 349/139 |
| 2005/0146693 A1 * | 7/2005 | Ohsaki | G03F 7/7085 |
| | | | 355/53 |
| 2006/0023214 A1 | 2/2006 | Lof et al. | |
| 2007/0187606 A1 | 8/2007 | Adel et al. | |
| 2009/0208090 A1 * | 8/2009 | Nishiura | G06F 18/28 |
| | | | 382/149 |
| 2011/0033790 A1 * | 2/2011 | Mishima | G03F 9/7065 |
| | | | 430/30 |
| 2012/0094401 A1 * | 4/2012 | Markwort | G01N 21/9501 |
| | | | 257/E21.53 |
| 2013/0088704 A1 * | 4/2013 | Mei | G03F 7/20 |
| | | | 355/72 |
| 2014/0151089 A1 * | 6/2014 | Choi | H05K 3/28 |
| | | | 174/250 |
| 2014/0168648 A1 * | 6/2014 | Hashimoto | G01B 11/028 |
| | | | 356/401 |
| 2015/0055125 A1 | 2/2015 | Tzai et al. | |
| 2015/0346605 A1 | 12/2015 | Den Boef et al. | |
| 2016/0146740 A1 | 5/2016 | Lu et al. | |
| 2016/0282730 A1 * | 9/2016 | Sasaki | G01B 11/272 |
| 2017/0278761 A1 * | 9/2017 | deVilliers | H01L 21/67103 |
| 2017/0336035 A1 * | 11/2017 | Lin | F21K 9/68 |
| 2018/0019139 A1 * | 1/2018 | Sun | B05D 1/005 |
| 2018/0031424 A1 | 2/2018 | Hill et al. | |
| 2018/0122668 A1 | 5/2018 | He et al. | |
| 2018/0149523 A1 * | 5/2018 | Zhao | G03F 7/7085 |
| 2018/0275523 A1 * | 9/2018 | Biafore | G01N 21/8851 |
| 2018/0329305 A1 | 11/2018 | Den Boef et al. | |
| 2018/0335346 A1 | 11/2018 | Hill et al. | |
| 2019/0180430 A1 * | 6/2019 | Lin | G06T 7/001 |
| 2020/0117100 A1 | 4/2020 | Corliss et al. | |
| 2020/0159133 A1 * | 5/2020 | Yan | H01L 23/544 |
| 2024/0145453 A1 * | 5/2024 | Lin | H01L 25/165 |

FOREIGN PATENT DOCUMENTS

| | | | | |
|---|---|---|---|---|
| JP | 2010-171375 A | | 8/2010 | |
| JP | 2011-40549 A | | 2/2011 | |
| JP | 2012195380 A | * | 10/2012 | |
| JP | 2020-515077 | | 5/2020 | |
| KR | 10-2011-0016398 A1 | | 2/2011 | |
| KR | 2014-0054219 A | | 5/2014 | |
| KR | 2015-0058455 A | | 6/2015 | |
| TW | 200612212 A | | 4/2006 | |
| WO | WO-2019139390 A1 | * | 7/2019 | ......... G03F 7/70633 |

OTHER PUBLICATIONS

Office Action issued Nov. 12, 2024, in corresponding Japanese Patent Application No. 2023-509488 (with English Translation), 8 pages.
Office Action Issued Mar. 25, 2025 in Japanese Patent Application No. 2023-509490 with English translation, 13 pages.
Notification of Examination Opinions and English translation, issued by the Taiwanese IPO on Jun. 12, 2025, 6 pages.
Korean Office Action issued Jul. 11, 2025, in Patent Application No. 10-2023-7003958 (with English translation), 18 pages.
Taiwan Office Action issued Jul. 22, 2025, in Patent Application No. 110130332, (with English translation), 12 pages.
Korean Office Action issued Jul. 11, 2025, in Patent Application No. 10-2023-7004788 (with English translation), 15 pages.
Chinese Office Action dated Nov. 18, 2025 in Chinese Patent Application No. 202180056793.7, with English translation, 7 pages.

* cited by examiner

COAXIAL SEE-THROUGH INSPECTION SYSTEM

INCORPORATION BY REFERENCE

This present disclosure claims the benefit of U.S. Provisional Application No. 63/066,779, "Method for Producing Overlay Results with Absolute Reference for Semiconductor Manufacturing" filed on Aug. 17, 2020, which is incorporated herein by reference in its entirety.

FIELD OF THE PRESENT DISCLOSURE

The present disclosure relates generally to methods of fabricating semiconductor devices and specifically to overlay error.

BACKGROUND

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

SUMMARY

Aspects of the present disclosure provide an inspection system. For example, the inspection system can include an imaging module and processing circuitry. The imaging module can image a wafer with a first light beam and a second light beam that is coaxially aligned with the first light beam. The first light beam can image a first pattern located on a front side of a wafer to form a first image. The second light beam can image a second pattern located below the first pattern to form a second image, and have power sufficient to pass through at least a portion of a thickness of the wafer and reach the second pattern. The processing circuitry can perform image analysis on the first image and the second image to calculate at least one of an overlay value of the first pattern and the second pattern and inspect defects of the wafer. In an embodiment, the second pattern can include a radioactive or fluorescent material. In another embodiment, the second pattern can include at least one of a point, a line, a corner, a box, a triangle, a number and a mark.

In an embodiment, the second pattern can be incorporated in a reference plate located below the wafer. For example, the reference plate can be placed on or adhered to a back side of the wafer. As another example, the reference plate can be incorporated in a substrate holder of a photolithography scanner or stepper. In another embodiment, the second pattern can be projected on a surface of the wafer.

In an embodiment, the second pattern can be formed on a back side of the wafer, and the second light beam can have the power sufficient to pass through an entire thickness of the wafer and reach the second pattern. In another embodiment, the second pattern can be embedded within the wafer.

In an embodiment, the second wavelength can have a second wavelength longer than a first wavelength of the first light beam. 10. For example, the first wavelength can be 50-400 nanometers, and the second wavelength can be 1-10 micrometers. As another example, the first wavelength can be 266 nanometers, and the second wavelength can be 3.6 or 3.7 micrometers.

In an embodiment, the inspection system can further include an ultraviolet (UV) light source configured to generate the first light beam, and an infrared (IR) light source configured to generate the second light beam. For example, the second pattern can be imaged via quantum tunneling imaging or IR transmission imaging.

In an embodiment, the second pattern can be coaxially aligned with the wafer.

In an embodiment, the processing circuitry can perform the image analysis by identifying coordinate locations of the first pattern relative to the second pattern as the overlay value.

As can be appreciated, as fabrication progresses on a given wafer, depending on a given device being created, there can be many different materials and layers. Thus each wafer at each process stage can have a different profile. This means a different wavelength may be needed to pass through the wafer.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
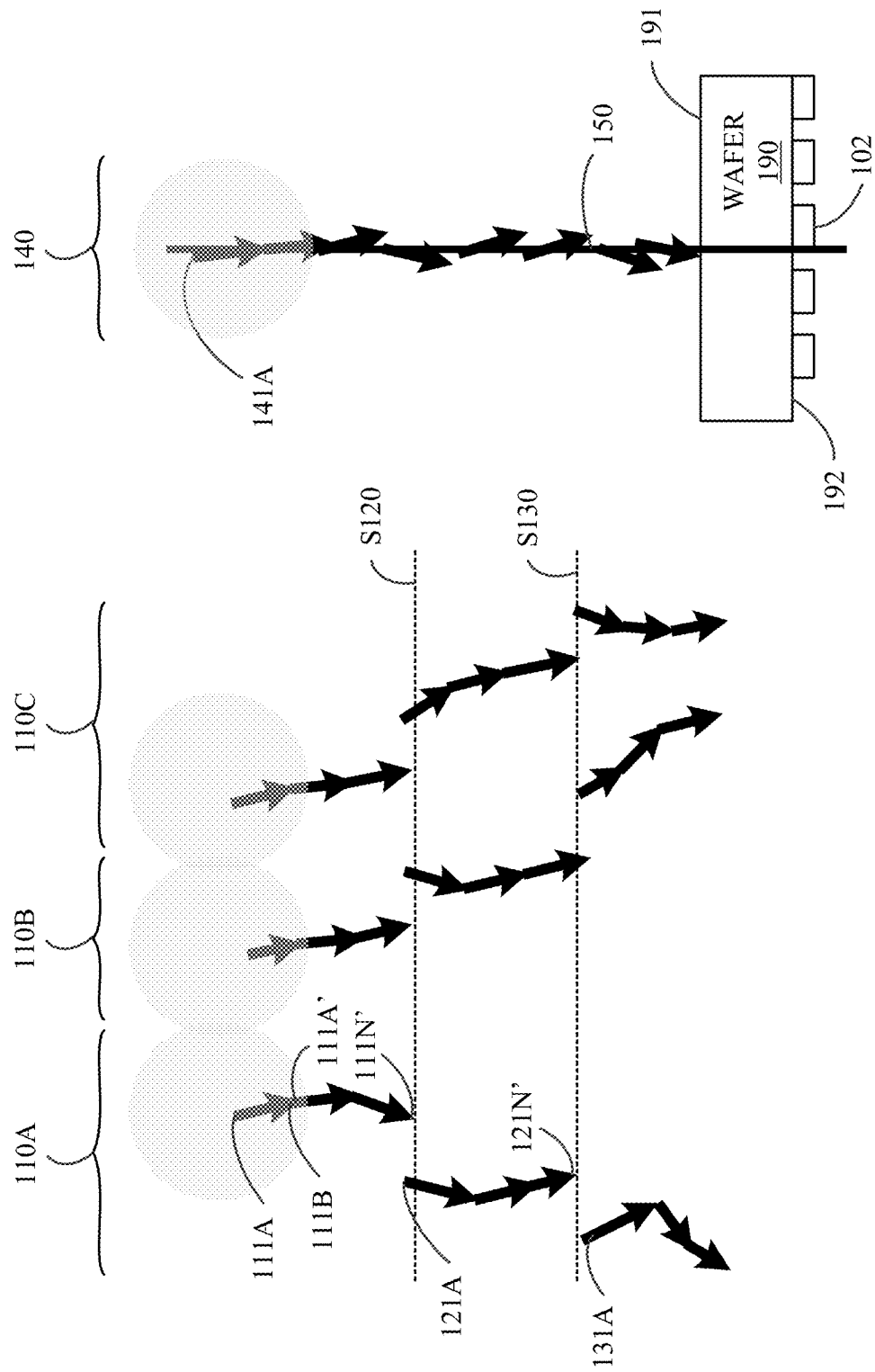
FIG. 1A shows an industrial problem of overlay.
FIG. 1B shows overlay alleviation using an exemplary reference pattern in accordance with some embodiments of the present disclosure.

In accordance with the present disclosure, an imaging method is provided, which uses an absolute, independent reference pattern as an alignment mark for feature patterns to be aligned with, instead of being aligned with a previous pattern. The feature patterns can be formed on a front side of a wafer, and the reference pattern is independent of the front side of the wafer. For example, the reference pattern can be formed within or below the wafer. A first light beam (e.g., an ultraviolet (UV) light beam) of a first wavelength can be used to image the feature patterns formed on the first side of the wafer, and a second light beam (e.g., an infrared (IR) light beam) of a second wavelength can be used to image the reference pattern formed within or below the wafer. In an embodiment, the second light beam can be coaxially aligned with the first light beam. As the reference pattern is formed within or below the wafer, the second light beam has to "see through" a portion of the thickness or the entire thickness of the wafer in order to image the reference pattern. For example, the second light beam can have power or intensity sufficient to pass through a portion of the thickness or the entire thickness of the wafer, depending on whether the reference pattern is formed within or below the wafer, to capture an image of the reference pattern using quantum tunneling imaging, IR transmission imaging or the like. Therefore, UV images of the feature patterns and IR images of the reference pattern can be captured in the same light axis and superimposed on each other. Image analysis can then be performed for exposure, inspection, alignment or other processing. Although the UV and IR images are captured coaxially, transmission to an image detector may or may not be coaxial. For example, the coaxially captured images may be optically separated and transmitted to separate image detectors as discussed below.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Microfabrication involves forming and processing multiple films and layers on a wafer. This can include dozens or more films stacked on a wafer. Patterns applied to the wafer for various films and layers need to be aligned to previously-formed patterns. Conventionally, such alignment is realized by using part of the wafer to form alignment marks and scribe lines. However, the present inventors recognized that the various film deposition, etching, and treatment techniques at times cover the alignment marks and even completely remove the alignment marks. With alignment marks at times covered or missing, there can be errors applying subsequent patterns on the wafer. The term overlay or overlay error refers to the difference between placement of given pattern relative to a previously-placed pattern. With alignment marks routinely destroyed, overlay error can accumulate with additional layers, which can cause poor performance and device error.

FIG. 1A illustrates an industrial problem of overlay. Each arrow herein has a starting point (e.g., 111A, 111B, 121A and 131A), which corresponds to a position of a preceding pattern, and an endpoint or arrowhead (e.g., 111A', 111N', 121N'), which corresponds to a position of a subsequent pattern. As a result, each arrow represents an overlay value or overlay error when the subsequent pattern is formed over or side by side with the corresponding preceding pattern. In a process 110A, for example, there is no grid or reference plate when placing an initial pattern. Thus, a starting point 111A of a first arrow is likely to be misaligned, that is, the initial pattern can have a placement error, for example relative to the wafer edge. Then subsequent patterns try to align based on the corresponding last pattern. As illustrated in FIG. 1A, a starting point (e.g., 111B) of a subsequent arrow overlaps with an arrowhead (e.g., 111A') of a corresponding last or preceding arrow. In some embodiments, deterioration of alignment marks can cause alignment error for subsequent patterns placed by using such deteriorated alignment marks. Note that even in a theoretically perfect system, walkout can still occur. For example, if a system pattern placement tolerance is +/−4 nm and each level references a previous level. Take a reference level to be 0 error. A first layer then could be +4 nm off. A second layer alignment to the first layer could be +4 nm off, meaning the second layer is now +8 nm off the reference level. There are also process factors that induce or relieve stress throughout fabrication that can induce walkout/alignment shift even with pristine alignment marks visible that can add to accumulated error.

Further, alignment marks may be destroyed at a step S120 in a manufacturing process, and placement again happens without a reference mark. Deterioration of alignment marks can cause accumulation of alignment error with subsequent processing. Similar to the starting point 111A, a starting point 121A of a new arrow is likely to be misaligned. In the example of FIG. 1A, the starting point 121A deviates from an arrowhead 111N'. The process proceeds by aligning subsequent patterns based on the corresponding last pattern until alignment marks are destroyed again at a step S130. Similarly, placement happens without a reference mark, and a starting point 131A deviates from an arrowhead 121N'. As can be seen in FIG. 1A, as layers increase, the overlay error can accumulate leading to poor manufacturing yield, device error, etc. Note that the process 110A is a non-limiting example. Other processes (e.g., 110B and 110C) may have different overlay values (different arrows) and/or different steps.

FIG. 1B shows overlay alleviation using an exemplary reference pattern in accordance with some embodiments of the present disclosure. With techniques herein, all patterns (e.g., a pattern having a starting point 141A) placed on a front side (or working side) 191 of a wafer 190 are based on a same reference pattern 102. In an embodiment, the reference pattern 102 can be located below the front side 191 of the wafer 190. For example, the reference pattern 102 can be formed on a back side 192 of the wafer 190 or incorporated in the wafer 190. As another example, the reference pattern 102 can be incorporated in a reference plate (not shown in FIG. 1B), and the reference plate can be positioned below the wafer 190, placed on or adhered to the back side 192 of the wafer 190, or incorporated in a substrate holder of a photolithography scanner or stepper (not shown in FIG. 1B) that is used to hold the wafer 190. In other words, the reference pattern 102 is not affected by lithographic processes, such as etching, deposition, chemical mechanical polishing and the like, which are performed on the front side 191 of the wafer 190 in order to form patterns. Therefore, the reference pattern 102 is independent of the front side 191 of the wafer 190, and will be intact during the lithographic processing of the wafer 190. Accordingly, the reference pattern 102 can be used and considered absolute, or rather, independent of any patterns formed on the front side 191 of the wafer 190, and will not be changed from various deposition and etch steps performed on the wafer 190. In an embodiment, the reference pattern 102 can be compared to the wafer 190 when placing a new pattern. For an initial pattern, this means that the pattern can be fitted to the reference pattern 102. For subsequent patterns, this means that one or more patterns can still be compared to the reference pattern 102 to calculate overlay correction to return to a same alignment.

For example, in a process 140 the reference pattern 102 can be used to align an initial pattern on the front side 191 of the wafer 190. In one embodiment, the reference pattern 102 can be provided in a fixed position relative to the wafer surface such as by embedding the reference pattern 102 within the wafer 190 or providing the reference pattern 102 fixed to a back side 192 of the wafer 190. Consequently, a starting point 141A of a first arrow is aligned to the reference pattern 102, whose position is demonstrated as a reference line 150. Subsequent patterns are also aligned using the fixed absolute, independent reference pattern 102. A new photoresist layer may be formed for each subsequent pattern, but no alignment marks need to be formed and/or destroyed on the wafer 190 due to the reference pattern 102. As a result, arrows center around the reference line 150, meaning that the subsequent patterns are aligned to the reference pattern 102. Alignment may occur, for example, by moving a mask of the pattern image or moving the wafer 190 relative to the mask. Overlay error is therefore unlikely to accumulate as more and more layers are formed.

Figure 2:
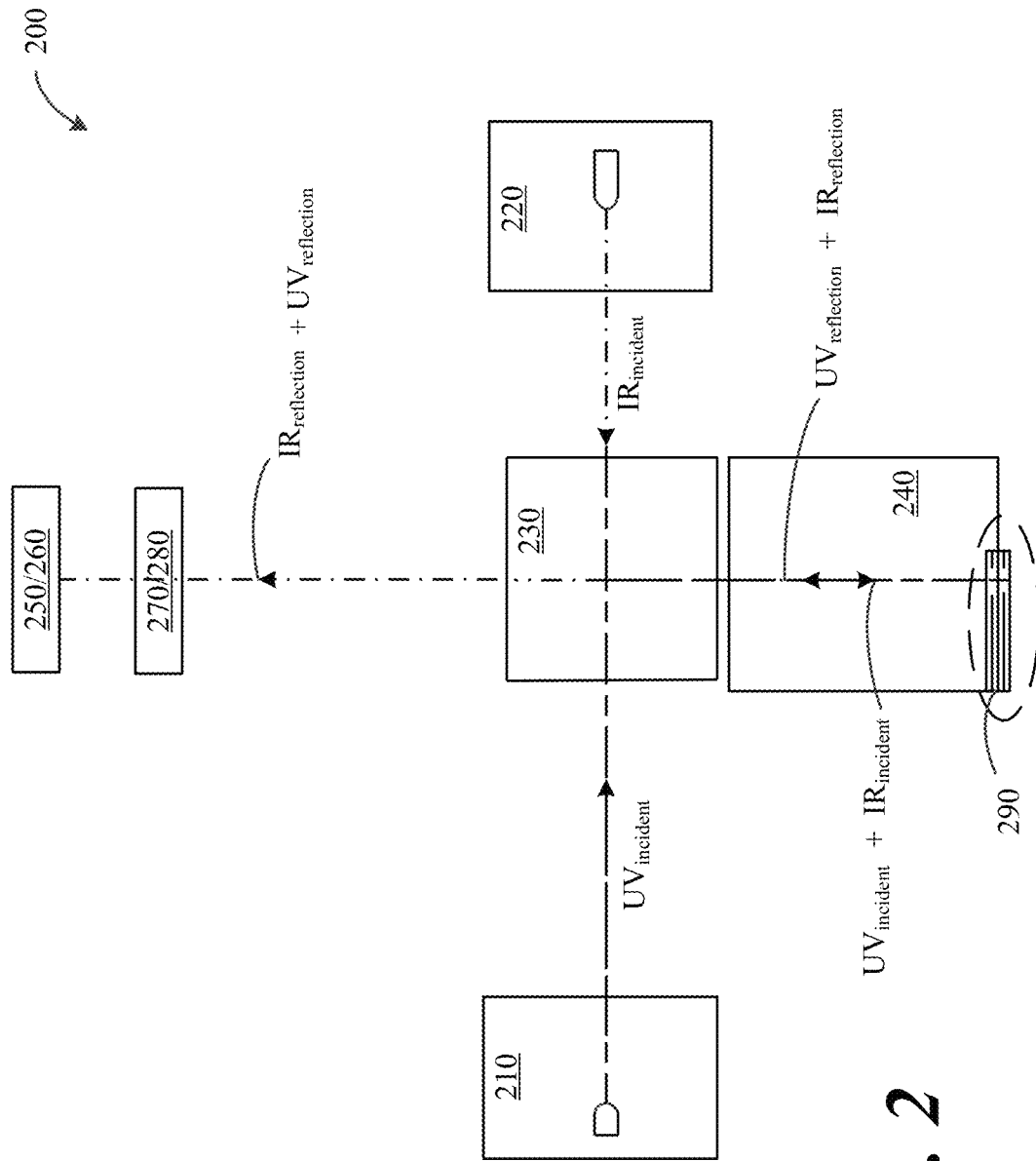
FIG. 2 is a functional block diagram of an exemplary imaging system in accordance with some embodiments of the present disclosure.

FIG. 2 is a functional block diagram of an exemplary imaging system 200 in accordance with some embodiments of the present disclosure. For example, the exemplary imaging system 200 can be implemented in a scanner or a stepper of a lithography system. As another example, the exemplary imaging system 200 can be implemented in a resist coating tool, e.g., CLEAN TRACK™ ACT™12 manufactured by Tokyo Electron Ltd, the resisting coating tool containing multiple mask-specific modules such as advance softbake oven units, edge-bead removal modules, and cleaning systems. The exemplary imaging system 200 can coaxially align two light beams of different wavelengths, focus the two coaxially aligned light beams onto a first pattern located on a front side of a substrate (e.g., a wafer) and a second pattern located below the first pattern, respectively, and capture images of the first and second patterns. For example, the exemplary imaging system 200 can include a first light source 210, a second light source 220, an alignment module 230, a coaxial module 240, a first image capturing device 250 and a second image capturing device 260. The first image capturing device 250 and the second image capturing device 260 can be referred to as an image capturing module collectively.

In an embodiment, the first light source 210 can be configured to generate a first incident light beam of a first wavelength. For example, the first light source 210 can be a UV light source that generates a first incident light beam of 50-400 nanometers, e.g., 266 nanometers (shown in FIG. 2 as $UV_{incident}$). As another example, the first light source 210 can be an Optowaves (Optowares Inc., Massachusetts, USA) solid state lasers, such as pumped nanosecond laser for surface imaging.

In an embodiment, the second light source 220 can be configured to generate a second incident light beam of a second wavelength. According to some aspects of the present disclosure, as an absolute, independent reference pattern shall be located below a pattern that is to be formed on a front side of a wafer and the second incident light beam is used to image the reference pattern, the second incident light beam has to see through at least a portion of a thickness or even the entire thickness of the wafer, such as a wafer 290.

Figure 3:
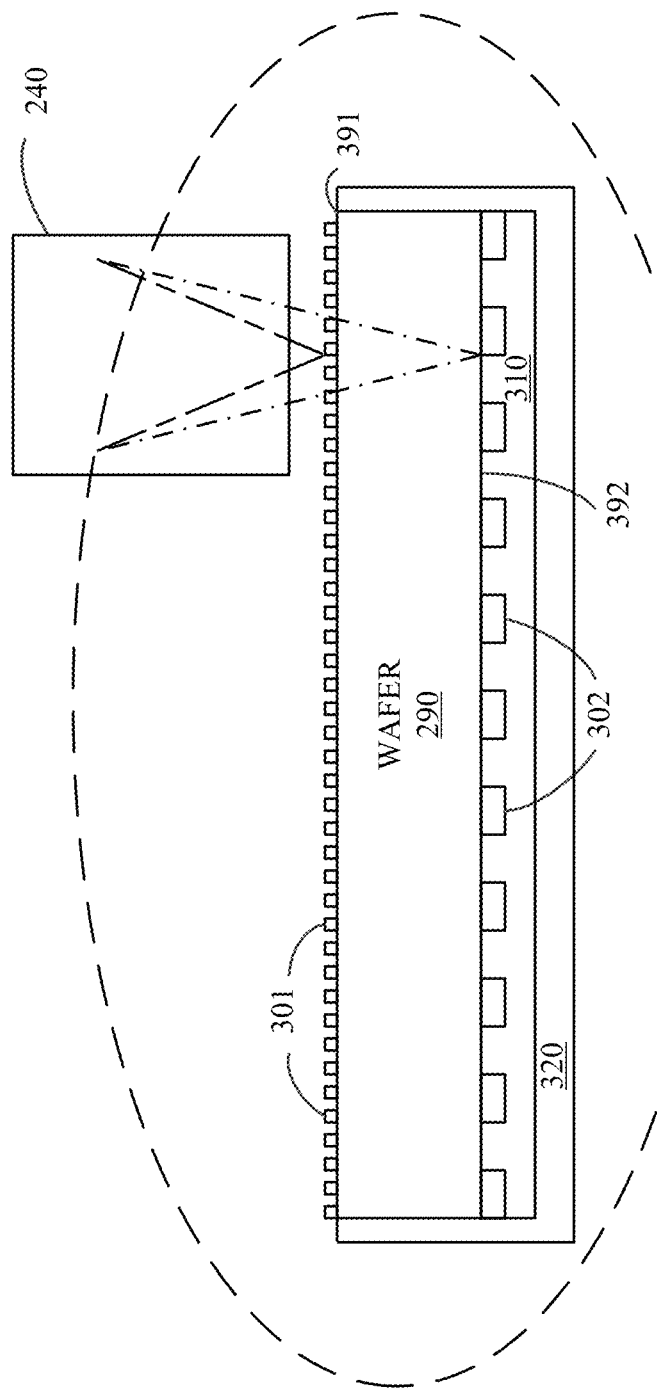
FIG. 3 is an enlarged view of a portion of coaxially aligned light beams generated by the exemplary imaging system of FIG. 2.

For example, the second incident light beam has power or intensity sufficient to pass through the entire thickness (e.g., 750 micrometers) of the wafer 290 to capture an image of the reference pattern using quantum tunneling imaging, IR transmission imaging or the like. As another example, the second light source 220 can be an IR light source that generates a second incident light beam of 1-10 micrometers, e.g., 3.6 or 3.7 micrometer (shown in FIG. 2 as $IR_{incident}$). In an embodiment, the second light source 220 can be IR tunable quantum cascade lasers, which can be obtained from Pranalytica, Inc. (California, USA). According to evanescent wave theory, a light beam impinging at a surface (e.g., a front side 391 of the wafer 290, as shown in FIG. 3) between two different media (e.g., the wafer 290 and air or liquid in immersion lithography where the coaxial module 240 is located) will have its intensity decayed exponentially perpendicular to the surface. The penetration depth over which the intensity drops to 1/e (approximately 37%) depends on, among other things, the wavelength of the light beam. Typical penetration depth can be a fraction of the wavelength of the light beam, e.g., ⅕ of the wavelength, depending on the incident angle of the light beam to the surface. As the second wavelength of the second incident light beam $IR_{incident}$ is much longer than the first wavelength of the first incident light beam $UV_{incident}$, the second incident light beam $IR_{incident}$, with power well controlled, can be capable of passing through the entire thickness of the wafer 290.

In an embodiment, the relative position of the first (UV) light source 210 and the second (IR) light source 220 can be calibrated periodically, which is also referred to as relative position of red and blue calibration. For example, the relative position of the first light source 210 and the second light source 220 can be kept within a sensor dynamic range which is a few decades and as such quite forgiving. Normalization, however, can be done with a stage artifact of known relative transmission being imaged as needed. For example, once a day so that any relative intensity normalization can be conducted easily. Relative position or TIS tool induced shift calibrations are common to metrology stations. Relative position is recalibrated against the grid plate in real time as measurements are made. Accordingly, the exemplary imaging system 200 can always have a real time absolute reference. Digital image capture and regression can be used.

In an embodiment, the alignment module 230 can be configured to coaxially align the second incident light beam $IR_{incident}$ with the first incident light beam $UV_{incident}$. For example, the alignment module 230 can include a first light beam splitter that splits the first incident light beam $UV_{incident}$ into two parts, one of which can be transmitted and the other of which can be reflected. In an embodiment, the first light beam splitter can be a prism. In another embodiment, the first light beam splitter can be a transparent plate, such as a sheet of glass or plastic, coated on one side thereof with a partially transparent thin film of metal, such as aluminum, which allows one part of the first incident light beam $UV_{incident}$ to be transmitted and the other part to be reflected. In the exemplary imaging system 200, the first light source 210 and the first light beam splitter can be arranged such that the first incident light beam $UV_{incident}$ is incident at a 45-degree angle to the first light beam splitter.

For example, the alignment module 230 can further include a second light beam splitter that splits the second incident light beam $IR_{incident}$ into two parts, one of which can be reflected and the other of which can be transmitted. For example, the second light beam splitter can be a prism. As another example, the second light beam splitter can be a sheet of glass or plastic coated on one side thereof with a thin film of aluminum, which allows one part of the second incident light beam $IR_{incident}$ to be reflected and the other part to be transmitted. In the exemplary imaging system 200, the second light source 220 and the second light beam splitter can be arranged such that the second incident light beam $IR_{incident}$ is incident at a 45-degree angle to the second light beam splitter.

For example, the alignment module 230 can further include a third beam splitter that allows light beams of different wavelengths to be either reflected or transmitted. For example, the third beam splitter can be a transparent plate coated on one side thereof with a dichroic material that allows the first incident light beam $UV_{incident}$ of the first wavelength that is transmitted from the first light beam splitter to be reflected, and the second incident light beam $IR_{incident}$ of the second wavelength that is transmitted from the second light beam splitter to be transmitted. In an embodiment, the third beam splitter is designed and located such that the transmitted second incident light beam $IR_{incident}$ is coaxially aligned with the reflected first incident light beam $UV_{incident}$ and the transmitted second incident light beam $IR_{incident}$ and the reflected first incident light beam $UV_{incident}$ can travel to the wafer 290 along the same light path.

In an embodiment, the coaxial module 240 can be configured to focus the first incident light beam $UV_{incident}$ reflected from the third beam splitter onto a first pattern 301 (shown in FIG. 3) located on a front side 391 of the wafer 290, and focus the second incident light beam $IR_{incident}$ transmitted from the third beam splitter onto a second pattern 302 (or a reference pattern) located below the first pattern 301. For example, the coaxial module 240 can be designed and configured to adjust the tolerances of the placement (i.e., depth of focus (DOF)) of the first pattern 301 and the second pattern 302. For example, a level sensor can be used to track the top of the first pattern 301 and subtract the height of the first pattern 301 by the height of the wafer 290 to auto-adjust the DOFs of the coaxially aligned first incident light beam $UV_{incident}$ and second incident light beam $IR_{incident}$ simultaneously. With deep UV (DUV) light, photoresist damage can be negligible. A 250-micrometer field of view (FOV) herein corresponds with about 60 nanometers per pixel in the case of 4K resolution. It is sufficient for resolution of 0.1-nanometer registration error measurement. Having sufficient power or intensity of light source can mitigate any shadowing of metal layers. While FIG. 3 shows imaging of a physical pattern formed in the wafer 290, images of a pattern to be formed (i.e., prior to exposure to activating light) may be realized by light having a wavelength that does not activate photoresist in the wafer, for example.

In an embodiment, the coaxial module 240 can include 2-12 individual optical elements, e.g., 6 optical elements. Each of the optical elements can include sapphire, AlN, MgF, CaF, BaF, LiF, Ge, Si, etc.

The first incident light beam $UV_{incident}$ can be reflected by the first pattern 301 to form a first reflection light beam $UV_{reflection}$. The first reflection light beam $UV_{reflection}$ can be reflected by the third beam splitter and the first light beam splitter sequentially and captured by the first image capturing device 250, and the first image capturing device 250 can form a corresponding first image of the first pattern 301. For example, the first image capturing device 250 can be DataRay camera. The second incident light beam $IR_{incident}$ can be reflected by the second pattern 302 to form a second reflection light beam $IR_{reflection}$. The second reflection light beam $IR_{reflection}$ can be transmitted by the third beam splitter and the second light beam splitter sequentially and captured by the second image capturing device 260, and the second image capturing device 260 can form a corresponding second image of the second pattern 302. For example, the second image capturing device 260 can be a high speed, high definition middle wavelength IR (MWIR) camera, e.g., FLIR X8500 MWIR. In an embodiment, image analysis can be performed on the first image and the second image to calculate an overlay value to determine the placement of the first pattern 301. For example, the image analysis can be accomplished by superimposing the first image of the first pattern 301 and the second image of the second pattern 302 on each other, and identifying coordinate locations of the first pattern 301 relative to the second pattern 302. In some embodiments, the image analysis can be performed in real time so that the placement of the first pattern 301 can be adjusted in real time.

In an embodiment, the alignment module 230 can further include a first lens set and a second lens set. For example, the first lens set can include reflective and/or refractive optics that collimate the first incident light beam $UV_{incident}$ generated by the first light source 210 and direct the collimated first incident light beam $UV_{incident}$ to the first light beam splitter. As another example, the second lens set can also include reflective and/or refractive optics that collimate the second incident light beam $IR_{incident}$ generated by the second light source 220 and direct the collimated second incident light beam $IR_{incident}$ to the second light beam splitter.

In an embodiment, the exemplary imaging system 200 can further include a third lens set 270 and a fourth lens set 280. For example, the third lens set 270 can include reflective and/or refractive optics that focus the first reflection light beam $UV_{reflection}$ onto the first image capturing device 250. As another example, the fourth lens set 280 can also include reflective and/or refractive optics that focus the second reflection light beam $IR_{reflection}$ onto the second image capturing device 260.

In an embodiment, the exemplary imaging system 200 can further include optics that can capture diffracted light beams outside of the coaxial module 240 and direct them to the first image capturing device 250 and the second image capturing device 260.

In the exemplary embodiment shown in FIG. 3, the first pattern 301 can be included in a photomask (not shown) that is located on the front side 391 of the wafer 290. In an embodiment, the photomask can be placed in direct contact with the wafer 290 in a contact printing system. In another embodiment, the photomask can be placed away from the wafer 290 in a proximity printing system or in a projection printing system.

In the exemplary embodiment shown in FIG. 3, the second pattern 302 is located on a back side 392 of the wafer 290, and the second incident light beam $IR_{incident}$ has power sufficient to pass through the entire thickness of the wafer 290 to capture the second image of the second pattern 302 using quantum tunneling imaging, IR transmission imaging or the like. In an embodiment, the second pattern 302 can be formed on a reference plate 310. For example, the reference plate 310 can be a grid plate with 20 micrometers by 20 micrometers squares, nearly perfectly aligned, and the second pattern 302 can be a corner point of at least one of the squares. As another example, the reference plate 310 can include at least one of a point, a line, a corner, a box, a number, a mark, or any other pattern that is suitable for alignment purpose, and the second pattern 302 can be one of these. In an embodiment, the reference plate 310 can be adhered to the back side 392 of the wafer 290. Accordingly, the reference plate 310 and the wafer 290 can function as one module. In another embodiment, the reference plate 310 can be incorporated in a substrate holder 320 of a photolithography scanner or stepper. Although each time a given wafer may be placed on the substrate holder 320 in a different position or orientation as compared to a previous placement, this does not matter. For a given new pattern to be placed or exposed, the wafer can be imaged with the reference plate 310, e.g., the grid plate. The reference plate 310 can then provide a relatively reference point for identifying vectors to two or more points, from which vector analysis can be used to calculate an overlay correction adjustment in a next exposure. For example, when the wafer 290, if having no pattern yet, is placed over the reference plate 310, the wafer 290 will be coarsely pre-aligned to the reference plate 310. As another example, when the wafer 290, if having an existing pattern already, is placed over the reference plate 310, the existing pattern and the reference plate 310 can be co-axially aligned. In a conventional lithography process, measurement errors caused by wafer back side scratches, back side dust and/or substrate distortion due to heat, may impact overlay, but conventional overlay systems are often blind to these problems. Techniques herein include an independent reference plate and high spatial resolution to overcome these problems.

In an embodiment, the second pattern 302 can be formed on the back side 392 of the wafer 290, and the second incident light beam $IR_{incident}$ also has power sufficient to pass through the entire thickness of the wafer 290 to capture the second image of the second pattern 302 using quantum tunneling imaging, IR transmission imaging or the like. Other techniques can include embedding the second pattern 302 (e.g., grid lines) in the wafer 290 such as using a radioactive or fluorescent material.

In an embodiment, the second pattern 302 can be formed on the front side 291 of the wafer 290, and then a layer of silicon and/or silicon oxide is deposited thereon. For example, the layer of silicon and/or silicon oxide can have a thickness of 1-5 micrometers so that the second pattern 302 is effectively "embedded" in the wafer 290 and patterns can be formed on the layer of silicon and/or silicon oxide. Accordingly, the second incident light beam $IR_{incident}$ has to have power sufficient to pass through the layer of silicon and/or silicon oxide in order to capture the second image of the second pattern 302 using quantum tunneling imaging, IR transmission imaging or the like. As another example, the second pattern 302 can be formed on the back side 292 of the wafer 290 before a protection layer, such as silicon or silicon oxide formed on the back side 292 of the wafer 290. Consequently, the second pattern 302 can also be embedded in the wafer 290. Accordingly, the second incident light beam $IR_{incident}$ has to have power sufficient to pass through the entire thickness of the wafer 290 in order to capture the second image of the second pattern 302 using quantum tunneling imaging, IR transmission imaging or the like. In an embodiment, the second pattern 302 can be formed on a front side of a carrier wafer before the front side of the carrier wafer is bonded to a back side of a target wafer (e.g., the back side 392 of the wafer 290). As a result, the second pattern 302 can be sandwiched between the carrier wafer and the target wafer, which together function as one wafer. Accordingly, the second incident light beam $IR_{incident}$ has to have power sufficient to pass through the entire thickness of the target wafer in order to capture the second image of the second pattern 302 using quantum tunneling imaging, IR transmission imaging or the like. In some embodiments, light projection can also be used. For example, the second pattern 302 can be a projected grid that does not physically exist in the wafer 290, on a substrate holder or as a grid plate under the substrate holder. In some embodiments, the second pattern 302 may be a combination of physical marks and light projection. For example, physical reference marks may be provided on a peripheral region of a substrate holder that is not covered by a wafer placed on the substrate holder, and light projections can complete the reference pattern in the area of the wafer such that tunneling may not be necessary.

Figures 4A, 4B:
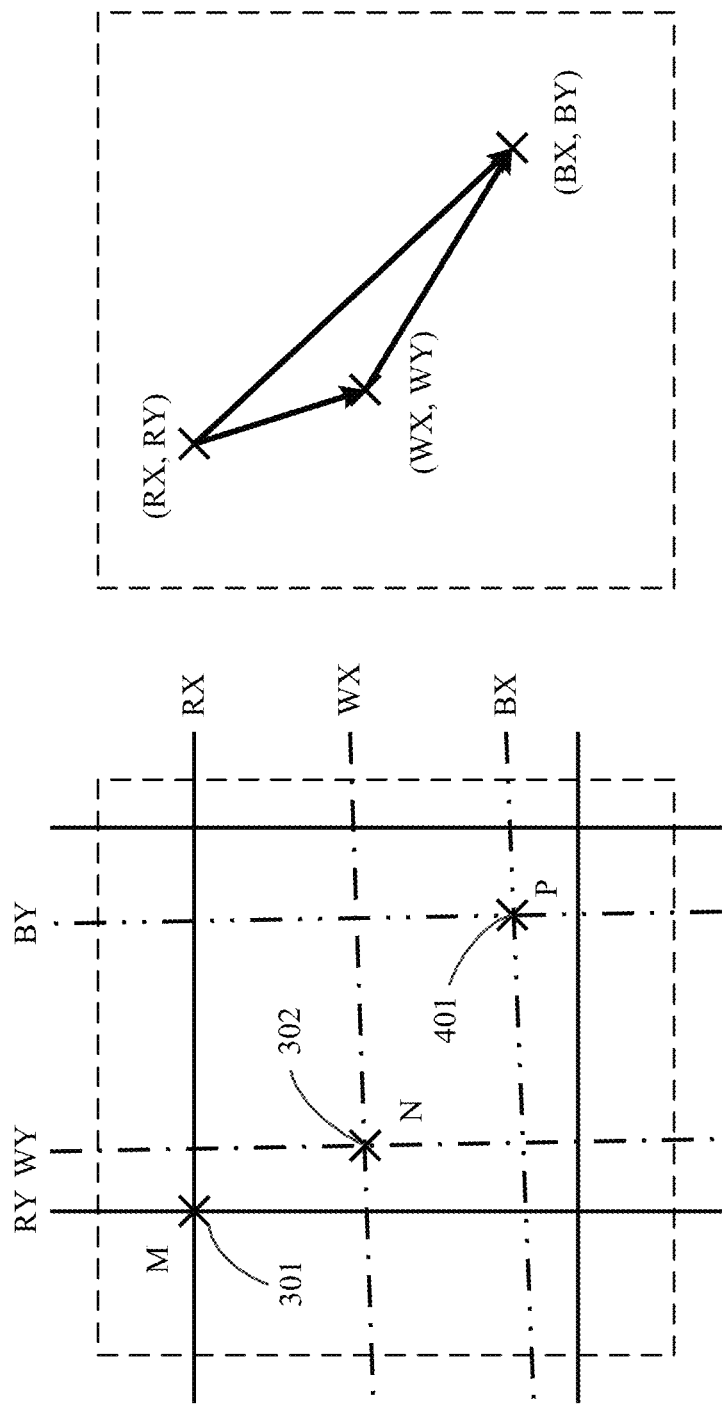
FIG. 4A shows an enlarged top view of superimposed images of a portion of a wafer captured by the first and second image capturing devices of the exemplary imaging system of FIG. 2 in accordance with some embodiments of the present disclosure FIG. 4B demonstrates exemplary image analysis for overlay calculation using an absolute, independent reference pattern in accordance with some embodiments of the present disclosure.

FIG. 4A shows an enlarged top view of superimposed images of a portion of the wafer 290 captured by the first image capturing device 250 and the second image capturing device 260, the portion including the first pattern 301 and the second pattern 302, in accordance with some embodiments of the present disclosure. FIG. 4B demonstrates exemplary image analysis for overlay calculation using the first pattern 301, which acts as a reference pattern in an alignment process, in accordance with some embodiments of the present disclosure. FIGS. 4A and 4B show how the absolute, independent first pattern 301 can be used to calculate an overlay value of two patterns. This can be done by knowing each common reference pattern to a co-ordinate system and using that reference pattern to know "where" each pattern is in that co-ordinate system. Once that is known, for example the distance between each layer, the vector calculation required to extract the overlay value is done with simple vector algebra. From that point, it is basic co-ordinate geometry. One can think of it as mix-match overlay (MMO) with a golden tool always there for oneself under the stage.

In an embodiment, the first pattern 301 (denoted by a point M), e.g., the corner of one of the squares of the grid plate with 20 micrometers by 20 micrometers squares, can be considered absolute or wafer-independent and used to calculate an overlay value between the second pattern 302 (denoted by a point N) and a third pattern 401 (denoted by a point P) that is formed subsequent to the formation of the second pattern 302. By superimposing the second pattern 302 on the first pattern 301, a coordinate difference or vector $\overrightarrow{MN}$ from the point M of the first pattern 301 to the point N of the second pattern 302 can be determined. Likewise, by superimposing the third pattern 401 on the first pattern 301, another coordinate difference or vector $\overrightarrow{MP}$ from the point M of the first pattern 301 to the point P of the third pattern 401 can also be determined. Then, an overlay value $\overrightarrow{NP}$ between the point N and the point P can be calculated:

$$\overrightarrow{NP} = \overrightarrow{MP} - \overrightarrow{MN}.$$

Further, with coordinate locations of points (e.g., N(Wx, Wy)) from the second pattern 302 and coordinate locations of points (e.g., P(Bx, By)) from the third pattern 401, an overlay value or shift from the second pattern 302 to the third pattern 401 can be determined. This overlay value can then be used to place the third or subsequent pattern to correct overlay relative to the independent reference pattern, e.g., the first pattern 301. In some embodiments, having a reference image that is uniform for every image comparison enables correcting adjacent patterns as well as keeping overlay corrections based on an initial line or absolute reference. Regarding concerns about critical dimension (CD) variation effects for resist layers, techniques herein can extract coordinates of the patterns without pattern CD variation effects for a resist layer and an under-layer thereof (e.g., metal resist patterns cover most of via patterns). CD variation effects for resist layers can be an issue for alignment and be ignored by overlay measurement teams as negligible. Techniques herein are far improved as the reference pattern itself is a far better indication of pattern placement than an alignment mark that suffers from CD's astigmatism and Zernike induced offset from patterns. Note that in some embodiments, superimposing images is not necessary. Coordinate location data can be collected from the reference plate and the working surface of the wafer, and then vector analysis can be used to determine a gross offset or an overlay value.

Figure 5:
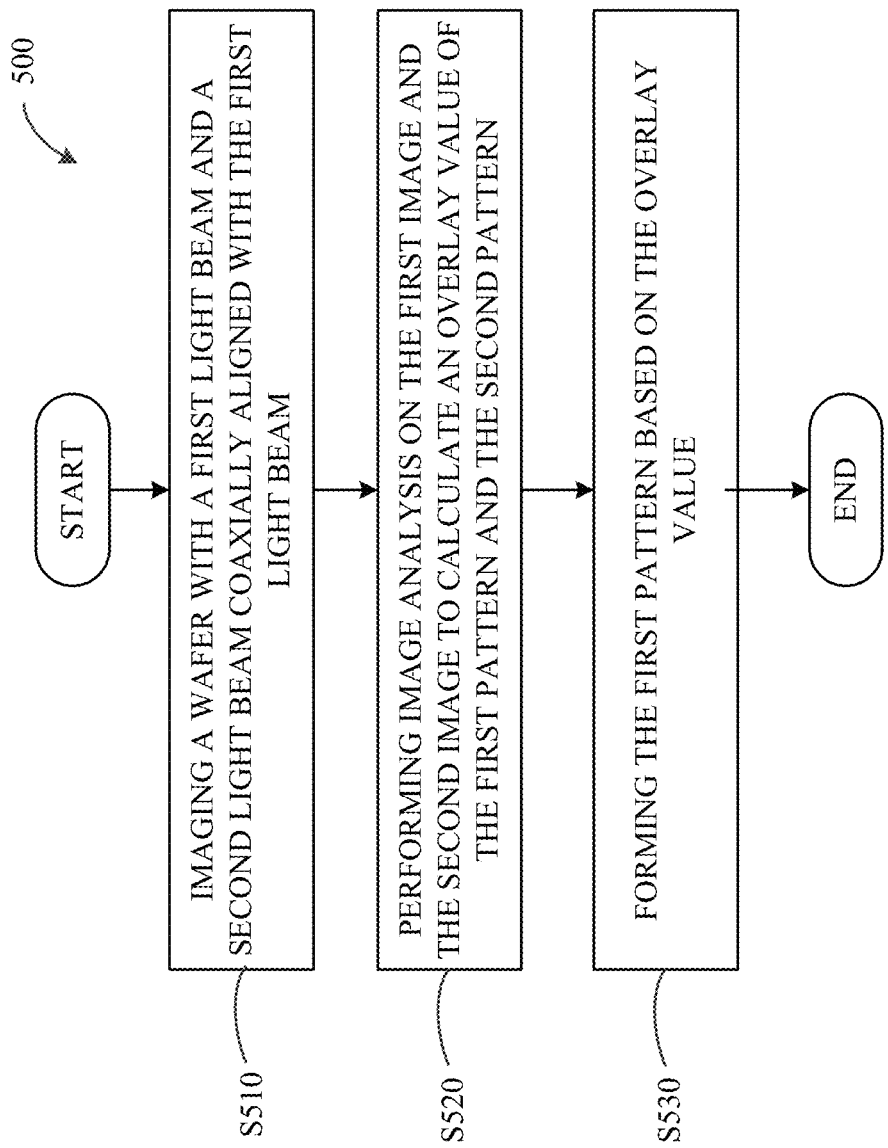
FIG. 5 is a flow chart illustrating an exemplary imaging method in accordance with some embodiments of the present disclosure.

FIG. 5 is a flow chart illustrating an exemplary imaging method 500 for processing a wafer (e.g., the wafer 290) in accordance with some embodiments of the present disclosure. The exemplary imaging method 500 can be applied to the exemplary imaging system 200. In various embodiments, some of the steps of the exemplary imaging method 500 shown can be performed concurrently or in a different order than shown, can be substituted by other method steps, or can be omitted. Additional method steps can also be performed as desired.

At step S510, a wafer can be imaged with a first light beam (e.g., the first incident light beam $UV_{incident}$) and a second light beam (e.g., the second incident light beam $IR_{incident}$) that is coaxially aligned with the first light beam. In an embodiment, the first light beam can image a first pattern located on a front side of the wafer to form a first image (e.g., by capturing the first reflection light beam $UV_{reflection}$), and the second light beam can image a second pattern located below the first pattern to form a second image (e.g., by capturing the second reflection light beam $IR_{reflection}$). For example, the second light beam can have power sufficient to pass through at least a portion of a thickness of the wafer and reach the second pattern. In an embodiment, the second light beam can have a second wavelength longer than a first wavelength of the first light beam. For example, the first light beam can be generated by the first light source 210 such as a UV light source, and the second light beam can be generated by the second light source 220 such as an IR light source. In an embodiment, the first wavelength is 50-400 nanometers, e.g., 266 nanometers, and the second wavelength is 1-10 micrometers, e.g., 3.6 or 3.7 micrometer. In an embodiment, the second pattern can be imaged via quantum tunneling imaging or IR transmission imaging In an embodiment, the second pattern can be incorporated in a reference plate, e.g., the grid plate with 20 micrometers by 20 micrometers squares with sub-nanometers positional accuracy, located below the wafer. For example, the reference plate can be placed or adhered to the back side of the wafer. Accordingly, the second light beam can have power sufficient to pass through the entire thickness of the wafer to capture the second image of the second pattern using quantum tunneling imaging, IR transmission imaging or the like. In another embodiment, the reference plate can be incorporated in a substrate holder or chick of a photolithography scanner or stepper, and the exemplary imaging method 500 can further include a step of aligning the reference plate with the wafer, prior to imaging the wafer with the first light beam and the second light beam. In yet another embodiment, the second pattern can be formed on the back side of the wafer. Accordingly, the second light beam can have power sufficient to pass through the entire thickness of the wafer to capture the second image of the second pattern 302 using quantum tunneling imaging, IR transmission imaging or the like. In still another embodiment, the second pattern can be embedded within the wafer and accessible through one or more layers. Accordingly, the second light beam can have power sufficient to pass through a portion of the thickness of the wafer to capture the second image of the second pattern 302 using quantum tunneling imaging, IR transmission imaging or the like. For example, the second pattern can include a radioactive or fluorescent material. As another example, the second pattern can include at least one of a point, a line, a corner, a box, a triangle, a number and a mark.

At step 520, image analysis can be performed on the first image and the second image to calculate an overlay value of the first pattern and the second pattern. For example, the image analysis can be performed by identifying coordinate locations of the first pattern relative to the second pattern as the overlay value, as shown in FIGS. 4A and 4B.

At step S530, the first pattern can thus be formed on the front side of the wafer based on the overlay value. For example, a photomask of the first pattern can be moved relative to the wafer based on the overlay value such that the first pattern is aligned with the second pattern, and a resist layer formed on the front side of the wafer can be exposed to allow the first pattern to be formed in the resist layer.

In an embodiment, in a "step-and-repeat" or "step-and-scan" system the first and second light beams and the photo mask can be moved to another area of the wafer, and steps S510-S530 can be repeated to form one or more patterns in the resist layer on the front side of the wafer.

A reference pattern used for patterning herein can be considered as absolute in one way, and relative in another.

For example, the reference pattern may keep or maintain fixed grid lines (or points or corners or boxes or any other suitable shapes) and is not changed from various deposition and etch steps on the wafer. In an embodiment, this can be a grid plate integrated with a stage or substrate holder. In this way the grid plate is absolute because the same physical grid plate is used throughout processing of the wafer, but relative because the physical grid plate is not fixed to the wafer itself and may be moved relative to the wafer throughout wafer processing. Although each time a given wafer is placed on the stage, it may be in a different location or orientation as compared to a previous placement; this does not matter. For a given new pattern to be placed or exposed, the wafer is imaged with the reference grid. The reference grid can then provide a relative reference point for identifying vectors to two or more points, from which vector analysis can be used to calculate an overlay correction adjustment in a next exposure.

The exemplary imaging system 200 and the exemplary imaging method 500 can be implemented as standalone coaxial metrology system and method that can operate in combination with a lithography tool, integrated track coaxial metrology system and method with feed forward to linked lithography cells, or active coaxial metrology system and method that can be embedded in a lithography tool for real time correction.

Figure 6:
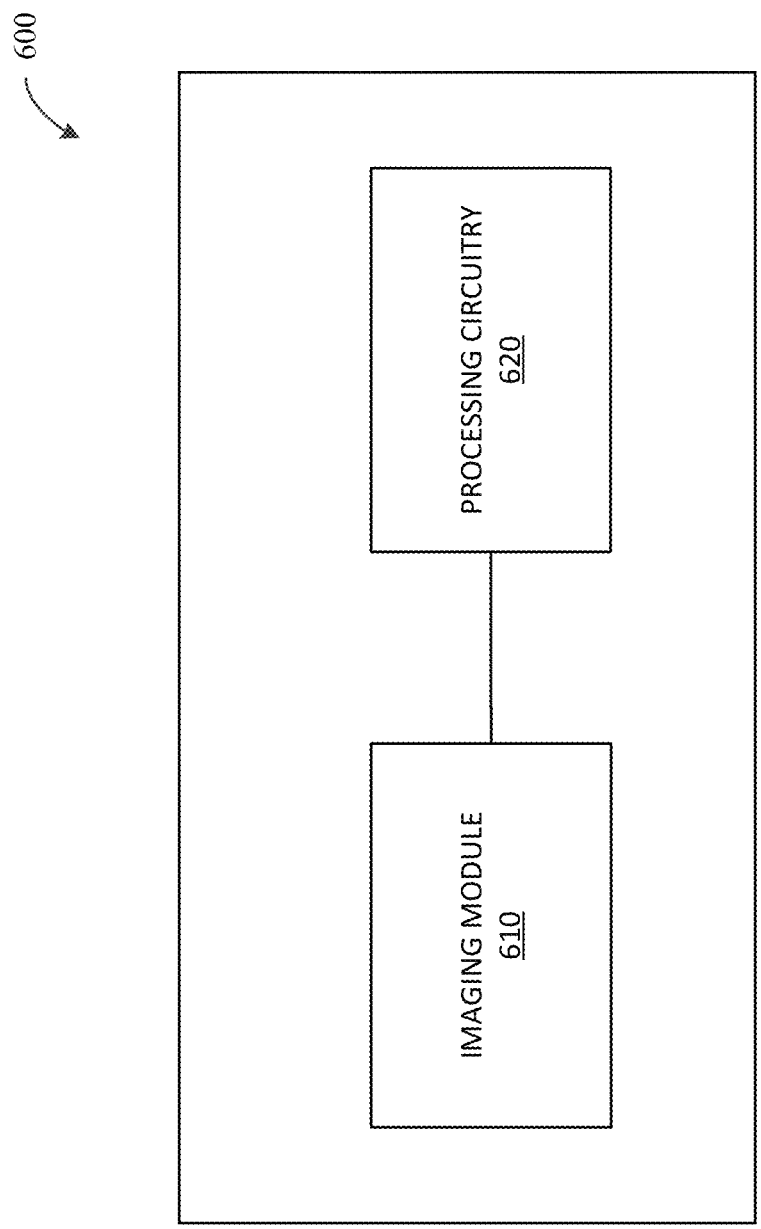
FIG. 6 is a functional block diagram of an exemplary inspection system in accordance with some embodiments of the present disclosure.

FIG. 6 is a functional block diagram of an exemplary inspection system 600 according to some embodiments of the present disclosure. The exemplary inspection system 600 can calculate an overlay value of a first pattern and a second pattern that are associated with a wafer and inspect defects of the wafer. For example, the exemplary inspection system 600 can include an imaging module 610, e.g., the imaging system 200, and processing circuitry 620. In an embodiment, the imaging module 610 can image a wafer with a first light beam and a second light beam that is coaxially aligned with the first light beam, the first light beam imaging a first pattern located on a front side of a wafer to form a first image, the second light beam imaging a second pattern located below the first pattern to form a second image, the second light beam having power sufficient to pass through at least a portion of a thickness of the wafer and reach the second pattern. For example, the imaging module 610 can image the wafer 290 with the first light beam generated by the first light source 210, e.g., a UV light source, and the second light beam generated by the second light source 220, e.g., an IR light source such as IR tunable quantum cascade lasers, the first light beam can image the first pattern 301 located on the front side 391 of the wafer 290, and the second light beam can image the second pattern 302 located below the first pattern 301 and have power sufficient to pass through at least a portion of the thickness of the wafer 290 and reach the second pattern 302. The processing circuitry 620 can perform image analysis on the first image of the first pattern 301 and the second image of the second pattern 302 to calculate an overlay value of the first pattern 301 and the second pattern 302.

Each wafer may have scratch impact, heat impact and chucking issues, etc., which are deep enough to impact overlay. The wafer may further have patterning defects, which may exist if lines are not connected as designed, critical dimensions are too small/too large, or there are gaps that would cause shorts. As the second light beam can pass through the wafer 290, the second light beam can also see the defects, and the second image captured can further include the information of the defects. In an embodiment, the processing circuitry 620 can further inspect any defects of the wafer 290 by performing the image analysis on the first image of the first pattern 301 and the second image of the second pattern 302.

Aspects of the present disclosure provide an imaging method, which can provide an accurate and precise alignment mechanism that does not rely on conventional alignment marks formed on a front surface of a wafer. Instead, with reference to a pattern or grid within/below the wafer, a reliable reference pattern can be repeatedly accessed for precise and accurate registration and alignment of subsequent patterns. The techniques herein will wipe out the need for traditional overlay marks. These novel paradigms for overlay can require no clear outs, no loss in real-estate and no complex scribe line design, making silicon area utilization improved and no complex integrations for alignment marks. The exemplary reference pattern disclosed herein will not be impacted and wiped out by unfavorable processes that are making devices instead of the alignment marks, as they often are conventionally. Overlay placement accuracy can also now be measured from the very first layer where the second pattern is located, as the reference pattern is now not only near perfect every time but hidden right under the stage there always.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. An inspection system, comprising:
an imaging module configured to image a wafer with a first light beam and a second light beam that is coaxially aligned with the first light beam, the first light beam imaging a first pattern located on a front side of a wafer to form a first image, the second light beam imaging a second pattern located below the first pattern to form a second image, the second light beam having power sufficient to pass through at least a portion of a thickness of the wafer and reach the second pattern; and
processing circuitry configured to perform image analysis on the first image and the second image to calculate at least one of an overlay value of the first pattern and the second pattern and inspect defects of the wafer,
wherein the first light beam has a first wavelength that is 266 nanometers, the second light beam has a second wavelength that is 3.6 or 3.7 micrometers, and the first light beam and the second light beam are generated by separate light sources.

2. The inspection system of claim 1, wherein the second pattern is formed on a back side of the wafer.

3. The inspection system of claim 1, wherein the second pattern includes a radioactive or fluorescent material.

4. The inspection system of claim 1, wherein the second pattern includes at least one of a point, a line, a corner, a box, a triangle, a number and a mark.

5. The inspection system of claim 1, wherein the second pattern is incorporated in a reference plate located below the wafer.

6. The inspection system of claim 5, wherein the reference plate is placed on or adhered to a back side of the wafer.

7. The inspection system of claim 5, wherein the reference plate is incorporated in a substrate holder of a photolithography scanner or stepper.

8. An inspection system, comprising:
an imaging module configured to image a wafer with a first light beam and a second light beam that is coaxially aligned with the first light beam, the first light beam imaging a first pattern located on a front side of a wafer to form a first image, the second light beam imaging a second pattern incorporated in a reference plate located below the wafer to form a second image, the second light beam having power sufficient to pass through an entire thickness of the wafer and reach the second pattern, the wafer containing silicon; and
processing circuitry configured to perform image analysis on the first image and the second image to calculate at least one of an overlay value of the first pattern and the second pattern and inspect defects of the wafer,
wherein the reference plate is adhered to a back side of the wafer.

9. The inspection system of claim 8, wherein the second light beam has a second wavelength longer than a first wavelength of the first light beam.

10. The inspection system of claim 9, wherein the first wavelength is in a range of 50-400 nanometers, and the second wavelength is in a range of 1-10 micrometers.

11. The inspection system of claim 10, wherein the first wavelength is 266 nanometers, and the second wavelength is 3.6 or 3.7 micrometers.

12. The inspection system of claim 9, further comprising an ultraviolet (UV) light source configured to generate the first light beam, and an infrared (IR) light source configured to generate the second light beam.

13. The inspection system of claim 8, wherein the second pattern is coaxially aligned with the wafer.

14. The inspection system of claim 8, wherein the processing circuitry performs the image analysis by identifying coordinate locations of the first pattern relative to the second pattern as the overlay value.

* * * * *